(12) United States Patent
Kusaka

(10) Patent No.: US 6,201,346 B1
(45) Date of Patent: Mar. 13, 2001

(54) EL DISPLAY DEVICE USING ORGANIC EL ELEMENT HAVING A PRINTED CIRCUIT BOARD

(75) Inventor: Teruo Kusaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/175,721

(22) Filed: Oct. 20, 1998

(30) Foreign Application Priority Data

Oct. 24, 1997 (JP) .................................. 9-292083

(51) Int. Cl.[7] .............................. H01J 1/62; H01J 63/04
(52) U.S. Cl. ...................... 313/504; 313/506; 313/509; 313/512
(58) Field of Search .................... 313/498, 500, 313/502, 503, 504, 505, 506, 507, 509, 510, 511, 512, 11, 12, 19, 20, 22–23, 27, 30, 33, 41, 42, 44–47

(56) References Cited

U.S. PATENT DOCUMENTS

| | | | |
|---|---|---|---|
| 5,332,946 | * 7/1994 | Eckersley et al. | 313/506 |
| 5,661,371 | * 8/1997 | Salerno et al. | 313/506 X |
| 5,686,792 | * 11/1997 | Ensign, Jr. | 313/509 |
| 5,808,412 | * 9/1998 | Zovko et al. | 313/509 |
| 5,844,362 | * 12/1998 | Tanabe et al. | 313/506 |

FOREIGN PATENT DOCUMENTS 61-231584   10/1986   (JP) .
9-71860      3/1997   (JP) .

OTHER PUBLICATIONS by C.C. Wu et al., "Integration of Organic LED's and Amorphous Si TFT's onto Unbreakable Metal Foil Substrates", *IEDM Tsch. Dig.*, 1996, pp. 957–959.
by C.C. Wu et al., "Organic LEDs Integrated with a-Si TFTs on Lightweight Metal Substrates", *SID 97 Digest*, May 1997, pp. 67–70.

* cited by examiner

Primary Examiner—Michael H. Day
Assistant Examiner—Mack Haynes
(74) Attorney, Agent, or Firm—Young & Thompson

(57) ABSTRACT

An EL display device has organic EL elements. In each organic EL element, an organic thin film having a transparent electrode on one surface and a metal electrode on the other surface is formed on a substrate, and positive and negative carriers are injected from the transparent electrode and the metal electrode, respectively, to emit light. The substrate is a circuit board having a metal interconnection, and the metal electrode of each organic EL element is formed at a predetermined portion on the upper surface of the circuit board.

9 Claims, 9 Drawing Sheets

EL DISPLAY DEVICE USING ORGANIC EL ELEMENT HAVING A PRINTED CIRCUIT BOARD

BACKGROUND OF THE INVENTION

1. Field of the Invention

The present invention relates to an EL display device using organic EL elements and a method of manufacturing the same and, more particularly, to an EL display device having an integrated structure of organic EL elements and drivers for them, and a method of manufacturing the same.

2. Description of the Prior Art

Conventional organic EL elements will be briefly described with reference to FIGS. 1 and 2.

Metal electrodes 14 that form anodes, an organic thin film 13, and metal electrodes 12 that form cathodes are formed on a transparent substrate 11 to build organic EL elements. In this structure, positive and negative carriers are injected from the negative electrodes 12 and positive electrodes 14, respectively, to emit light toward the transparent electrodes.

As a prior art for integrating organic EL elements and drivers for them to form an EL display device, one is reported by C. C. Wu et al. of Princeton University in "Integration of Organic LED's and Amorphous Si TFT's onto Unbreakable Metal Foil Substrates", IEDM Tsch. Dig., 957–959, 1996 at International Electron Device Meeting (IEDM 196) held in December, 1996.

The structure of the EL display device reported in this meeting is as shown in FIG. 3. This EL display device is a single-layer device using a stainless steel substrate 15. A Pt electrode 16 and a thin Ag electrode 18 having a thickness of 150 Å are formed as the anode and cathode, respectively, and a polyvinyl carbazole (PVK)-based polymer thin film 17 is formed as an organic film by spin coating. Emitted light is output to the thin Ag electrode 18 side.

In the structure shown in FIG. 3, although the organic EL element and the driver are integrated, the reported luminous efficiency of the organic EL element is as small as about 0.01%, which is by no means comparable to the luminous efficiency of 4% to 5% which is realized by a single organic EL element. Therefore, this EL display device was not evaluated except that it proposed an organic EL element on a new concept.

C. C. Wu et al. subsequently reported the structure of an EL display device shown in FIG. 4 at International Symposium (SID 197) of SID (Society for Information Display) held in May, 1997.

The structure shown in FIG. 4, regarding its stainless steel substrate 15, a Pt electrode (anode) 16, and a polymer thin film 17, is identical to that shown in FIG. 3 which is reported at IEDM '96. The difference of this structure resides in that the cathode is improved by fabricating it as a multilayer electrode consisting of a 150-Å MgAg film and a 400-Å ITO film, e.g., an ITO/thin MgAg laminated electrode (cathode) 19. According to the report, this improvement increased the luminous efficiency by about 1%.

In the structures shown in FIGS. 3 and 4, emitted light is output through the cathode. The structure shown in FIG. 3 uses an Ag film, which is in no way transparent, as a cathode. The thickness of this Ag film is decreased to obtain certain transparency. In the structure shown in FIG. 4, a transparent ITO film is used to provide an improvement in this point. However, the ITO film has an excessively large work function to make electron injection difficult (disadvantageous) due to ionization potential of the organic thin film. This difficulty is removed by interposing a thin MgAg film. In this case, although the emission efficiency is improved, since the MgAg film is by no means transparent, either, it decreases transmittance all the same.

A still another prior art is described in Japanese Unexamined Patent Publication No. 61-231584.

FIG. 5 is a perspective view showing the structure of an EL display device described in Japanese Unexamined Patent Publication No. 61-231584.

In the structure shown in FIG. 5, inorganic EL elements using an inorganic electroluminescent material, e.g., Zn:Mn, is formed on one major surface of a ceramic substrate 21. In order to connect the inorganic EL elements with drivers 27 integrally formed on the other surface of the ceramic substrate 21, interconnections that are connected to the inorganic EL elements on one side and to the drivers 27 on the other side are formed to extend through the ceramic substrate 21. This realizes integration of the inorganic EL elements and the drivers.

The structure shown in FIG. 5 is manufactured in the following manner.

As the inorganic EL elements of this EL display device, first electrodes 22 are formed on one major surface of the ceramic substrate 21, and subsequently an insulating layer 23, an inorganic emission layer 24, an insulating layer 25, and second electrodes 26 are sequentially formed.

Since emitted light is output to the second electrodes 26 side, transparent electrodes are used as the second electrodes 26. The material that forms the inorganic EL elements has high heat resistance. After the inorganic emission layer 24 is formed, the transparent second electrodes 26 are formed in accordance with ordinary sputtering.

Whereas the material that forms the inorganic EL elements has high heat resistance, the material of the organic EL elements lacks heat resistance. The difference in heat resistance of the material is one factor that has interfered with integration of the organic EL elements and their drivers.

Although the structure shown in FIG. 5 and the structure according to the present invention are similar in terms of integration, they are completely different in that this integration is enabled for organic EL elements in the present invention.

An inorganic EL element and an organic EL element have different emission mechanisms. Accordingly, whereas the inorganic EL element requires a drive voltage equal to or higher than 100 V, the organic EL element can be driven with a voltage of equal to or lower than 10 V. The reason the inorganic EL element requires a high drive voltage is that, unlike in the organic EL element, the inorganic EL element is not excited by recombination, but electrons collide against luminescent centers by electric field acceleration to emit light. The organic EL element has gained interest in terms of this drive voltage as well. However, the material of the organic EL element lacks heat resistance, as described above, and is conventionally difficult to integrate the organic EL element with the driver.

The temperature must be maintained to be equal to or lower than 80° C. throughout the entire process of the manufacture of the organic EL element, which is a very large limitation. For this reason, although the various advantages of integration, e.g., down-sizing, weight reduction, and cost reduction, are sufficiently recognized, conventionally, the structure as an EL display device is barely realized by using a polymer having comparatively high heat resistance among the organic EL element materials and forming an ITO film in accordance with RF magnetron sputtering by limiting the condition, as in the examples shown in FIGS. 3 and 4. When a polymer is compared with a low molecule-based organic EL element material widely used as the organic EL element material, although its heat resistance is better, it is not suited for vacuum deposition that can achieve good film formation, and it can only be applied to spin coating and the like.

Attempts have been constantly made to form a transparent electrode at low temperatures. A typical prior art related to this is the technique described in Japanese Unexamined Patent Publication No. 9-71860.

This technique is mainly based on the need for formation of an ITO electrode on a plastic substrate at a low temperature, and provides an improvement over the sputtering target. A target manufactured by mixing indium oxide and zinc oxide in an oxide of an element having a valance equal to or larger than +3 as needed, molding and sintering the mixture, and annealing the sintered body, and a method of manufacturing the same are known. As a practical example of the manufacture of a target, for example, a case is reported wherein film formation is performed under the conditions shown in Table 1 by using a target manufactured by mixing 254 g of $In_2O_3$ having a purity of 99.99% and an average particle diameter of 1 μm, 40 g of zinc oxide powder having a purity of 99.99% and an average particle diameter of 1 μm, and 6 g of titanium oxide powder having a purity of 99.99% and an average particle diameter of 1 μm.

In Table 1, the substrate temperature is room temperature. This probably means, in the absence of specific description, that the substrate is not heated or cooled particularly. During sputtering, the temperature of the substrate naturally rises due to excessive energy of the film formation particles.

TABLE 1

| Item | Content, condition |
| --- | --- |
| target size | diameter: 4 inches thickness: 5 mm |
| discharge method | DC magnetron |
| discharge current | 0.3 A |
| discharge voltage | 450 V |
| background pressure | $5 \times 10^{-4}$ Pa |
| introduced gas | Ar + $O_2$ gas mixture |
| pre-sputtering pressure | $1.4 \times 10^{-1}$ Pa |
| pre-sputtering time | 5 minutes |
| sputtering pressure | $1.4 \times 10^{-1}$ Pa |
| sputtering time | 1.5 to 20 minutes |
| substrate rotation speed | 6 rpm |
| substrate temperature | room temperature |

SUMMARY OF THE INVENTION

The present invention has been made in consideration of the above situation in the prior art, and has as its first object to provide a manufacturing method in which the limitation on the process that, due to poor heat resistance of the organic EL element material, an organic thin film can be formed only after a transparent electrode is formed is overcome, so that an organic thin film can be formed arbitrarily.

It is the second object of the present invention to eliminate conventional restriction that the material of the substrate of the organic EL element is limited to only a transparent material such as glass or plastic, so that materials of a wide range can be used. In connection with this, it is also an object of the present invention to provide a lightweight, low-profile, compact EL display device in which organic EL elements and drivers are integrated by using a printed wiring board made of, e.g., an epoxy resin, which is widely used as a circuit board, as the substrate of the organic EL elements.

In order to achieve the first object of the present invention, according to the manufacturing method of the present invention, when forming a transparent electrode (ITO thin film) on an organic thin film, a cooled metal mask is placed in a sputtering particle flow so that unwanted particles will not increase the temperature of the organic thin film. The energy of the sputtering particles that reach the surface of the substrate through a hole in the mask is suppressed to a minimum level, and some of the sputtering particles are ionized and accelerated with an electric field to replenish energy, thereby realizing stable film formation.

In order to achieve the second object of the present invention, according to the EL display device of the present invention, an organic thin film having a transparent electrode on one surface and a metal electrode on the other surface is formed on a substrate. Since emitted light is externally output through the transparent electrode, the substrate which is located on the opposite side to the transparent electrode with respect to the organic thin film and which is in contact with the organic thin film need not be transparent. More specifically, the substrate material need not be transparent, and substrate materials of a wide range can be used. As a typical example, an EL display device can be realized in which organic EL elements and drivers are integrated by forming the organic EL elements on a printed wiring board such that the printed wiring board and the organic EL elements are connected to each other. Integration provides effects such as reductions in the material cost, weight, thickness, number of processing steps, and size, that are achieved by reduction of the glass substrate and connection flexible leads (FPC).

In the conventional manufacturing method, maintaining the substrate temperature at room temperature means that substrate heating is not performed, and the substrate temperature during film formation is uncontrolled. According to the present invention, the substrate temperature during film formation is positively controlled to prevent an unwanted temperature increase.

The first effect obtained by the present invention is that a conventional limitation on the process that an organic thin film can be formed only after formation of a transparent electrode is eliminated. Accordingly, transparency is not an indispensable condition for the substrate, and organic EL elements can be arbitrarily formed on various types of substrates.

The second effect obtained by the present invention is that, in connection with the first effect, a circuit board such as a printed wiring board can be used as the substrate, so that a driver-integrated organic EL display can be realized. This integration allows manufacture of a lower-profile, lightweight, and compact organic EL display at a low cost.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Figure 1:
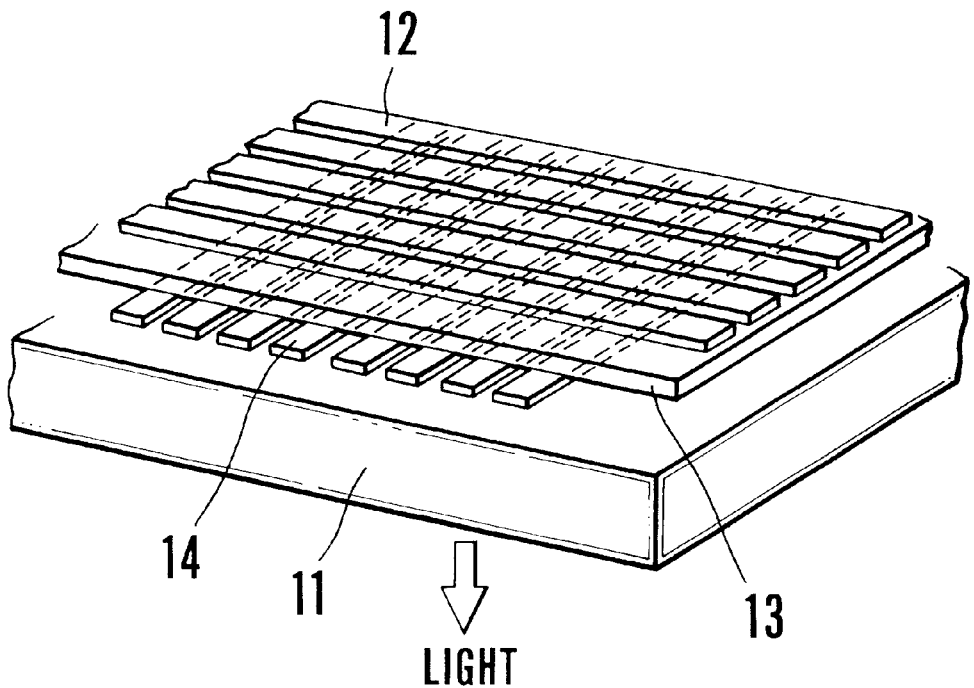
FIG. 1 is a perspective view showing the structure of a conventional versatile organic EL display.
Figure 2:
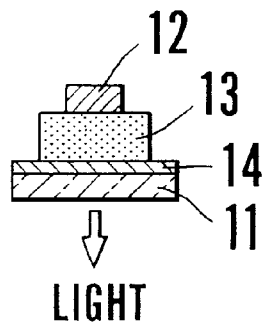
FIG. 2 is a sectional view showing the schematic overall structure of a conventional versatile organic EL element.
Figure 3:
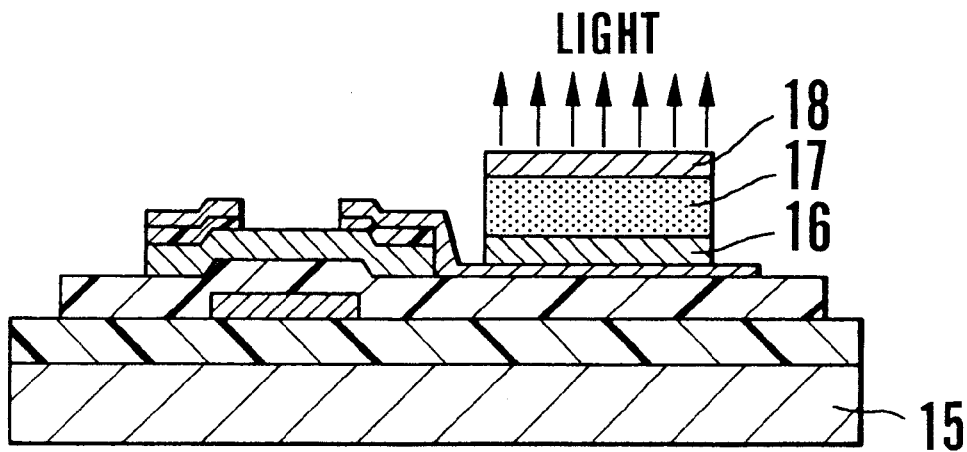
FIG. 3 is a sectional view showing an example of a conventional driver-integrated organic EL element.
Figure 4:
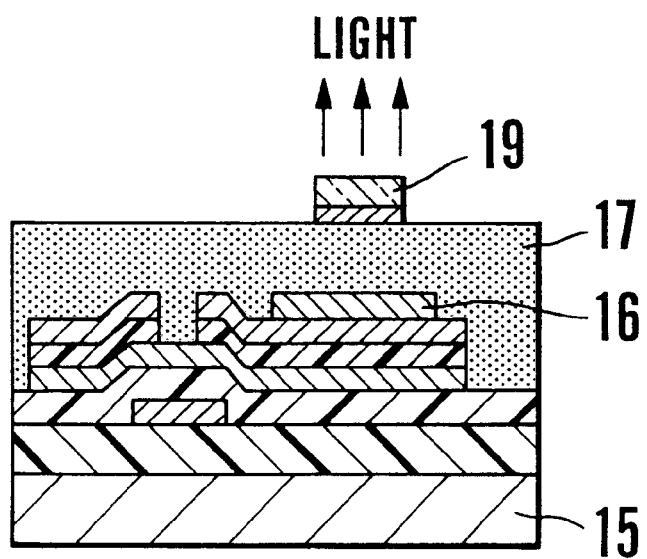
FIG. 4 is a sectional view showing another example of a conventional driver-integrated organic EL element.
Figure 5:
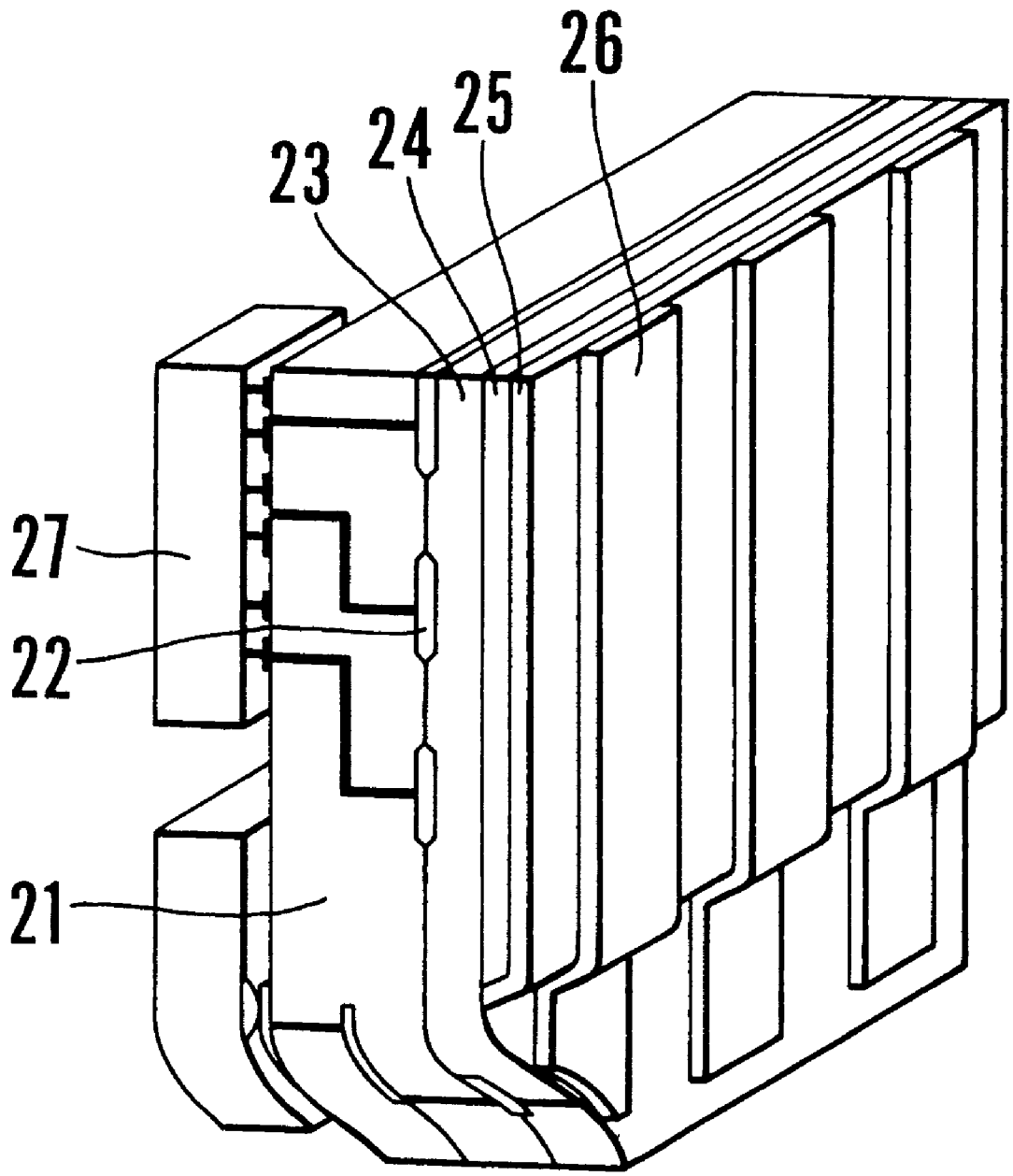
FIG. 5 is a perspective view showing a conventional driver-integrated inorganic EL display.
Figure 6:
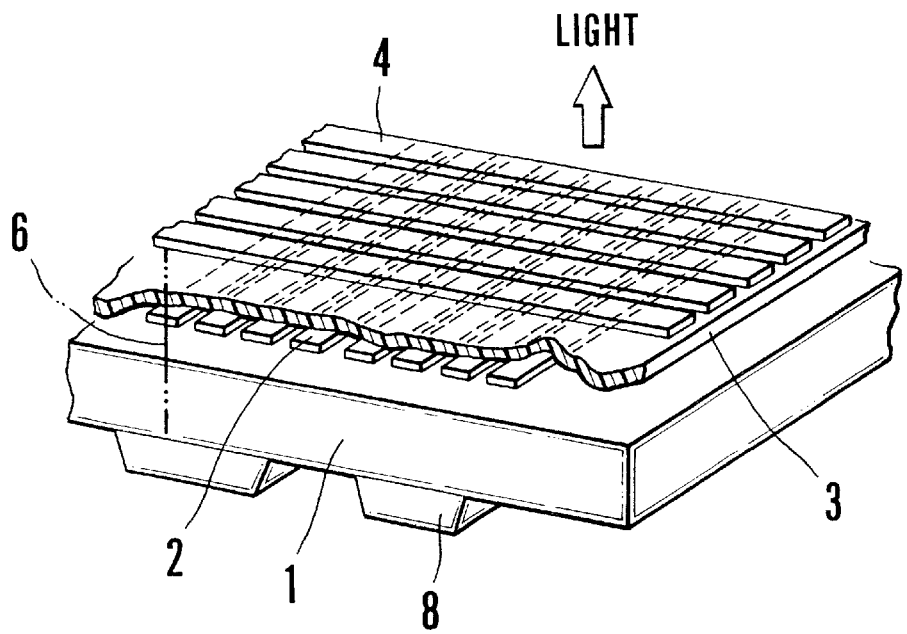
FIG. 6 is a perspective view showing an embodiment of the present invention.

Several preferred embodiments of the present invention will be described in detail with reference to the accompanying drawings.

Referring to FIGS. 6 to 14, according to the best basic embodiment of the present invention, metal electrodes 2 that form cathodes when completed are formed on the upper surface of a board 1 called a printed wiring board or PWB. An organic thin film 3 of organic EL elements is formed to cover the metal electrodes 2, and thereafter transparent electrodes 4 that form anodes are formed on the organic thin film 3.

Ordinarily, the metal electrodes 2 and transparent electrodes 4 are formed in stripes to perpendicularly intersect each other through the organic thin film 3. The respective metal electrodes 2 and transparent electrodes 4 are electrically connected to metal pads 5 that are insulated from each other.

Each metal pad 5 is connected to a via interconnection 6 that connects the upper and lower surfaces of the board 1, and is connected to a metal interconnection 7 on the lower surface of the board 1. Circuit components 8, e.g., ICs such as latch-up circuits, drivers, or microcomputers, and capacitors and resistors accompanying the ICs, are mounted (connected to the metal interconnections 7) on the lower surface of the board 1 to form drivers. In other words, organic EL elements are formed on the upper surface of the board 1, and the drivers are formed on the lower surface of the board 1. The organic EL elements and the drivers are integrated.

Although not shown in the structure shown in FIGS. 6 to 9, as the completed structure, the organic EL elements are encapsulated with a transparent cap or transparent resin. In the manufacturing process of FIG. 10, a resin encapsulating step is performed.

The first embodiment of the present invention will be described.

As a practical example of the present invention, a commercially available glass epoxy-based printed wiring board is used as a board 1. There is no special reason for the use of the glass epoxy-based printed wiring board, and basically any board material can be used. Note that since an organic thin film is formed by vacuum deposition and transparent electrodes are formed by sputtering, as will be described later, organic EL elements must be able to withstand these processes. For example, no expansion of bubbles in the board or no boiling of water content or solution in the board should occur in vacuum. Preferably, since the durability of the organic EL elements is impaired by water content and oxygen, it is better to choose a material having a less water content and less oxygen.

The wiring pattern, including via interconnections 6 and metal pads 5, must be order-made. The material of the interconnections (not shown in the drawings) of the board 1 is Cu, and part of the interconnections may be directly utilized as metal electrodes 2. In this embodiment, in order to improve the performance of the organic EL elements, when forming the metal electrodes 2, a thin film having a thickness of about 0.2 $\mu$m to 1.5 $\mu$m, containing Al as the major component and added with a small amount of halogen element, e.g., Li, to about 1 weight % was formed on the entire surface by vacuum deposition or sputtering, and were patterned into stripes by photolithography. Other than this method, methods such as a method of patterning the thin film into stripes without employing photolithography but in accordance with a shadow mask method using a metal mask can be employed.

Figure 7:
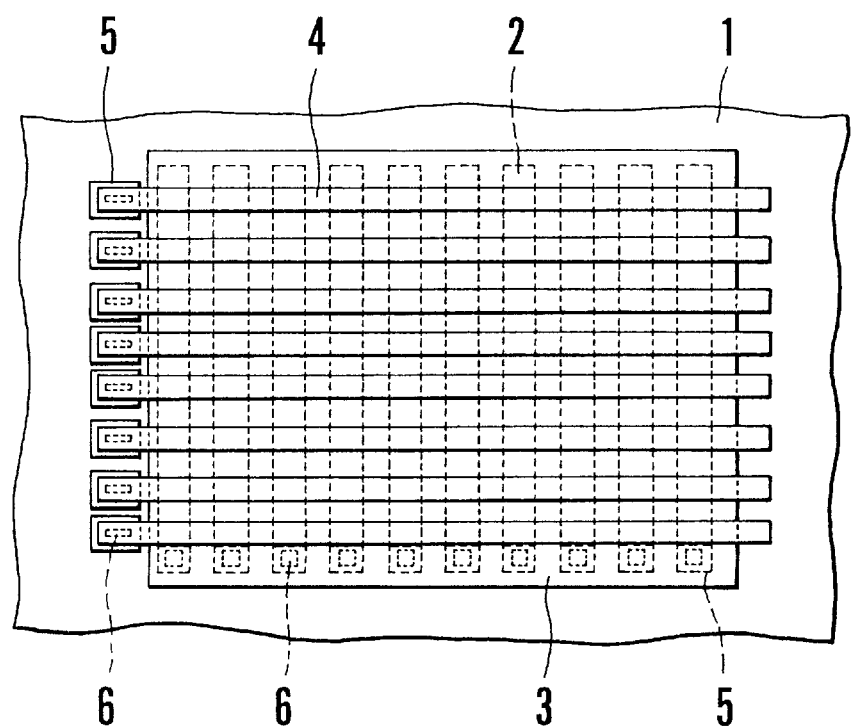
FIG. 7 is a plan view of the embodiment shown in FIG. 6.
Figure 8:
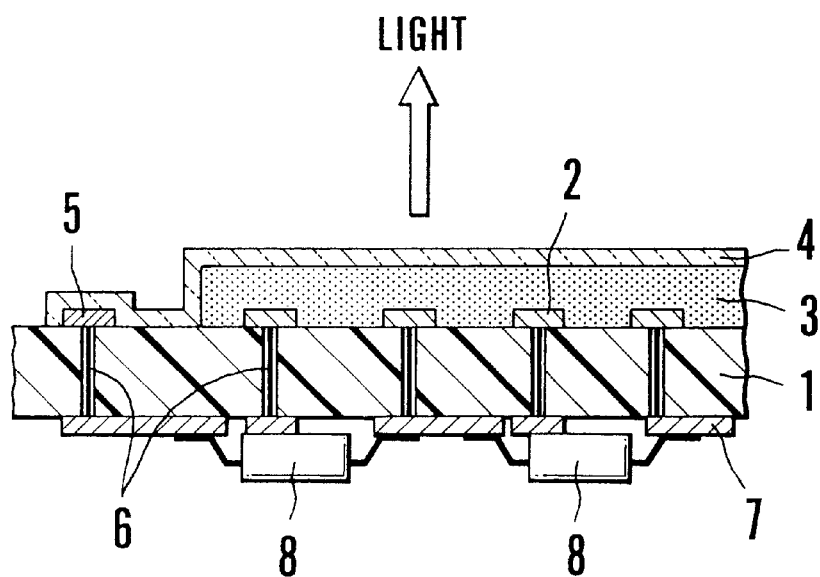
FIG. 8 is a sectional view of the embodiment shown in FIG. 6.
Figure 9:
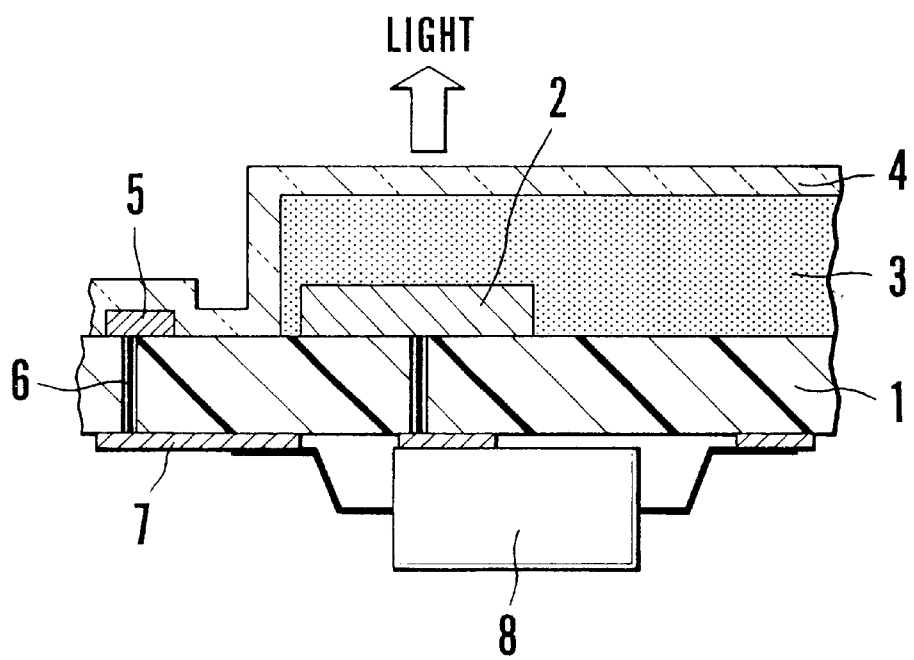
FIG. 9 is an enlarged sectional view of FIG. 8.
Figure 10:
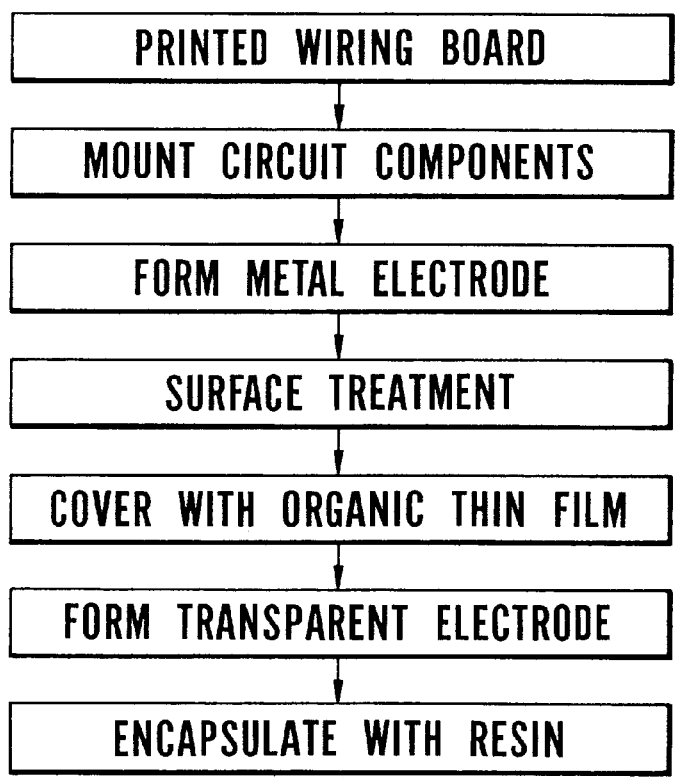
FIG. 10 is a flow chart of the entire process of the manufacturing method of the present invention.

The stripes are formed to have a pitch of 0.25 mm to 1.5 mm and a space (gap) of about 0.01 mm to 0.1 mm. The pitch and space of the stripes formed in practicing the present invention are not particularly significant but can be arbitrary ones that compromise with the levels required as a display and the micropatterning level. After the surfaces of the metal electrodes 2 are treated with the cleaning process shown in FIG. 12, organic solvent treatment using IPA alcohol or the like is performed. The resultant structure is cleaned with an ultrasonic flow of pure water, and the surfaces of the metal electrodes 2 are lightly etched with a rare HF solution or the like, and are cleaned with an ultrasonic flow of pure water. After that, the resultant structure is sufficiently dried in an inert atmosphere, e.g., nitrogen gas, and is set in a vacuum deposition machine to form an organic thin film 3 of the next step shown in FIG. 10 by vacuum deposition. Although the organic thin film 3 is formed not to cover the peripheral portion, as shown in FIG. 7, it is not patterned to correspond to the individual metal electrodes 2 or transparent electrodes 4 (a so-called solid layer).

Figure 11:
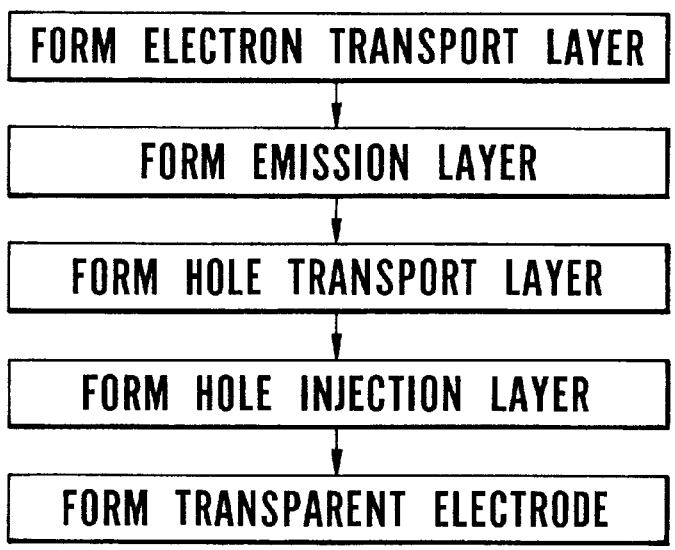
FIG. 11 is a flow chart of an element formation process in the manufacturing method of the present invention.
Figure 12:
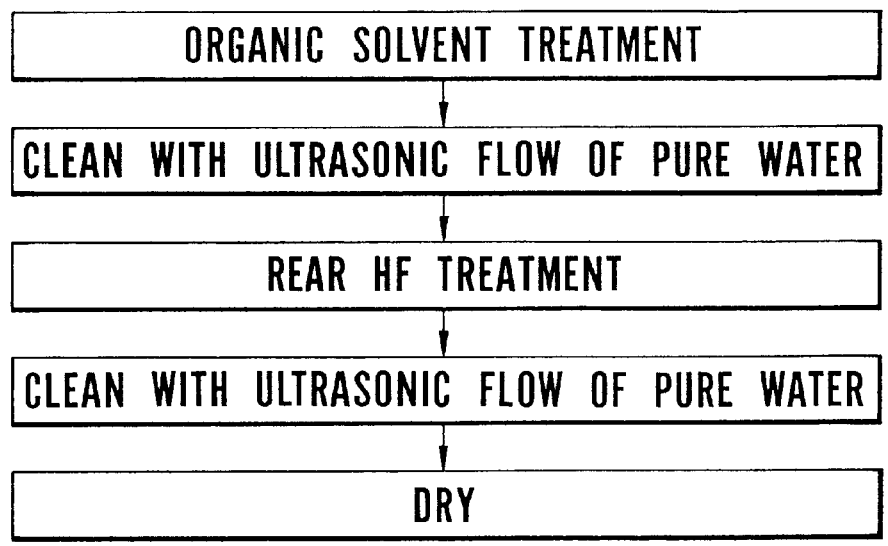
FIG. 12 is a flow chart of a cleaning process in the manufacturing method of the present invention.

The thickness of the organic thin film 3 is about 100 nm to 300 nm, and to be more specific, the organic thin film 3 has a multilayer structure consisting of about 2 to 4 layers. FIG. 11 shows the manufacturing process of an organic thin film having a four-layer structure. Opposite to the case of an ordinary glass board, as shown in FIG. 11, an electron transport layer is formed, an emission layer is formed on the electron transport layer, and thereafter a hole transport layer and a hole injection layer are formed. In the case of the embodiment, practically, an aluminum quinoline complex Alq$_3$ is used as an electron transport material, Alq$_3$ doped with quinacridone by co-deposition is used as an electroluminescent material, diamine TPD is used as a hole transport material, and copper phthalocyanine CUPC is used as a hole injection material. The thickness of each layer is about 5 nm to 150 nm. To obtain good characteristics, the thickness must be optimized. In practicing the present invention, other organic EL materials can also be used.

After the organic thin film 3 is formed, the transparent electrodes 4 are formed. After formation of the organic thin film 3 and before formation of the transparent electrodes 4, the process is preferably performed without breaking vacuum. Although the present invention can be practiced by breaking vacuum as well, it is disadvantages in terms of characteristics and formation of dark spots (dotted non-emission regions in an emission region).

In the embodiment of the present invention, the vacuum deposition machine and the magnetron sputtering device that forms the transparent electrodes 4 are connected to each other hermetically, and the transparent electrodes 4 can be continuously formed without breaking vacuum. Another point to be observed in formation of the transparent electrodes 4 is to prevent temperature increase in formation process as much as possible.

On the basis of the target described in Japanese Unexamined Patent Publication No. 9-71860 indicated as the prior art and the film formation condition recommended in this reference, the present invention is particularly devised to suppress any increase in the temperature of the board. The first measure is that a metal mask for patterning the transparent electrodes 4 is inserted in the sputtering flow and is cooled by heat transfer. Transparent electrode particles attaching to the surface of the organic thin film 3 cannot form a film of a good quality unless they have necessary heat or kinetic energy, and accordingly they cannot be cooled. The metal mask plays no part in film formation. In the present invention, the metal mask is cooled by heat transfer by using its holder so that radiation heat from it is decreased.

The transparent electrodes 4 are formed to have a thickness of about 100 nm to 300 nm in about 10 minutes. Ordinarily, as time passes, the temperature of the board 1 increases. Regarding the quality of film formation of the transparent electrodes 4, particularly its initial film formation state when the transparent electrodes 4 constitute an interface with the organic thin film 3 influences the characteristics of the organic EL elements. Even if a transparent electrode film having a good quality is formed as the temperature increases, it does not necessarily have improved characteristics.

In the present invention, a mechanism for cooling the board 1 is added to perform control so that the temperature of the board 1 does not increase. Furthermore, part of the sputtering flow is ionized to control the energy of the particles attaching to the surface of the organic thin film 3 by an electric field. These necessary, not excessive control operations are enabled, and the temperature of the board 1, to be more correctly the temperature of the organic thin film 3, can be suppressed to a value that the organic thin film 3 can withstand, which is estimated to be about 65° C.

Figure 13:
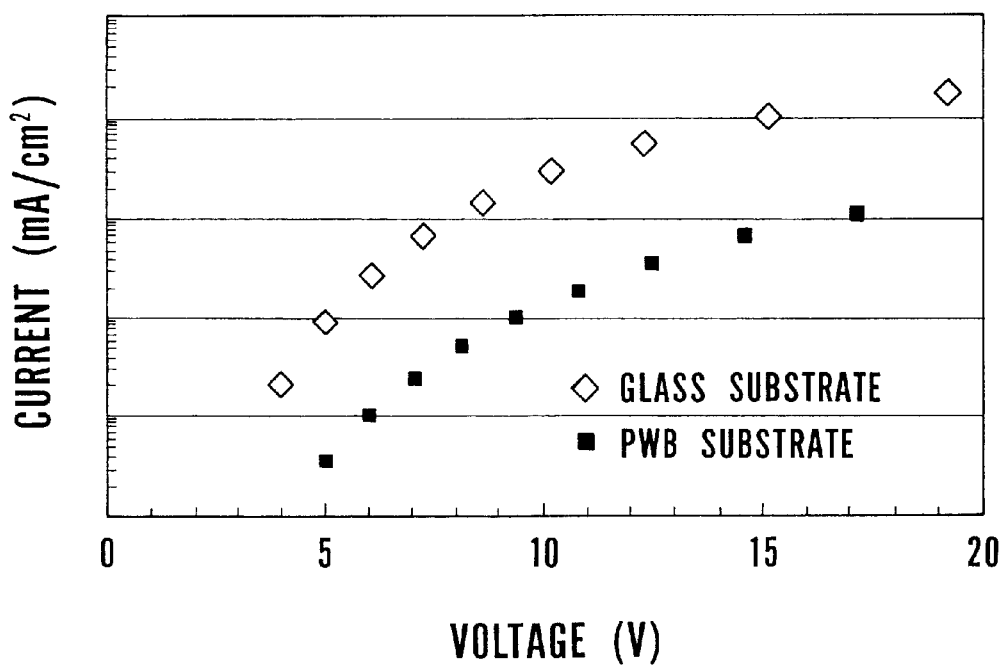
FIG. 13 is a graph showing the current-voltage characteristics of an organic EL element, which is fabricated in accordance with the manufacturing method of the present invention, in comparison with a conventional element using a glass substrate.
Figure 14:
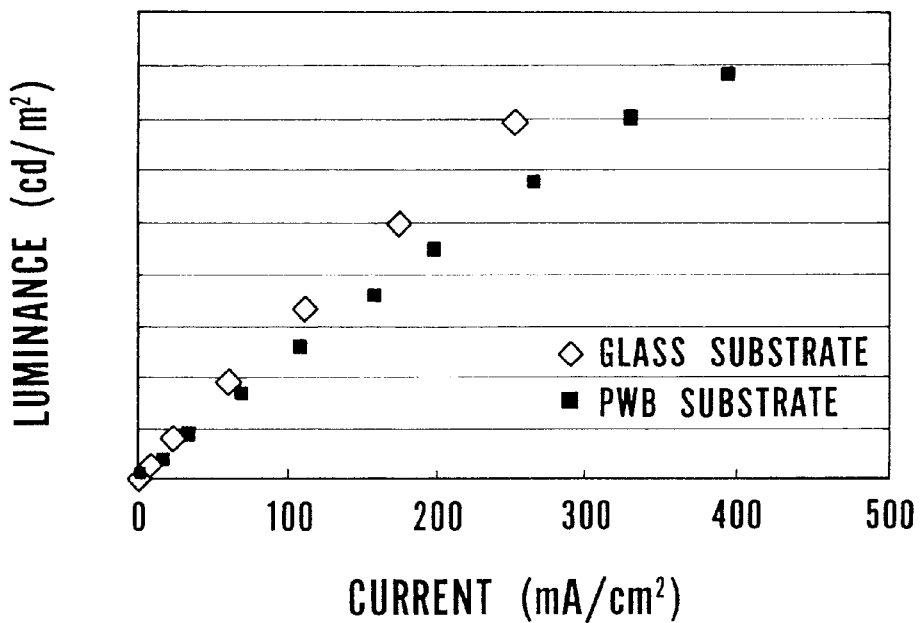
FIG. 14 is a graph showing the luminance-current characteristics of the organic EL element, which is fabricated in accordance with the manufacturing method of the present invention, in comparison with the conventional element using the glass substrate.

FIGS. 13 and 14 show the current-voltage characteristics and the luminance-current characteristics of an organic EL element, which is fabricated by practicing the present invention, in comparison with the characteristics of the conventional organic EL element using a glass substrate. Although the characteristics of the present invention are slightly inferior to those of the conventional organic EL element, characteristics with which an organic EL display can be set are obtained.

Figure 15:
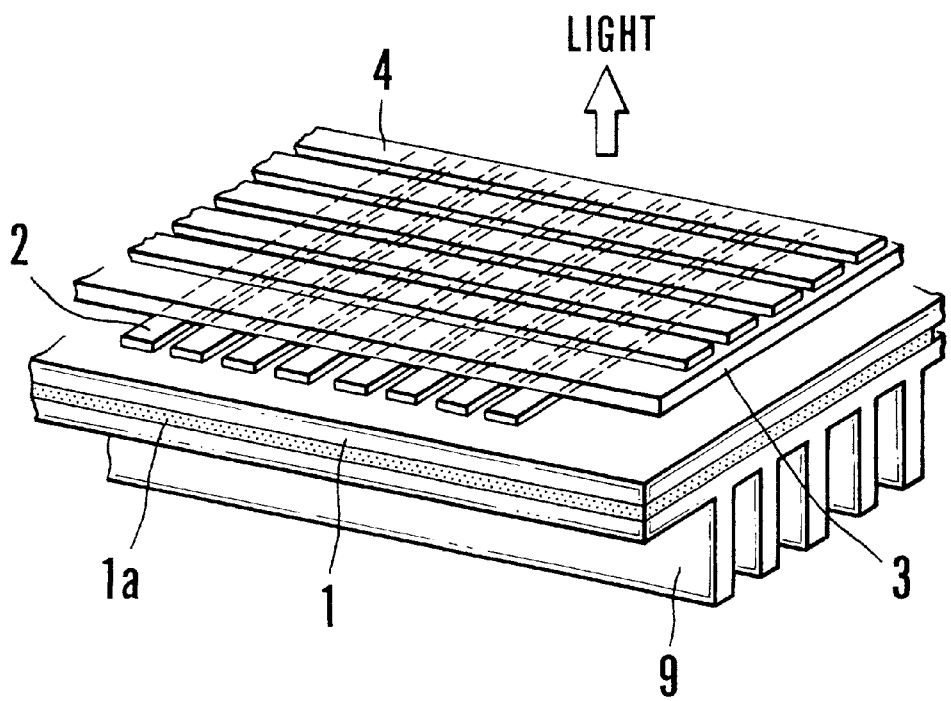
FIG. 15 is a perspective view showing the second embodiment of the present invention.
Figure 16:
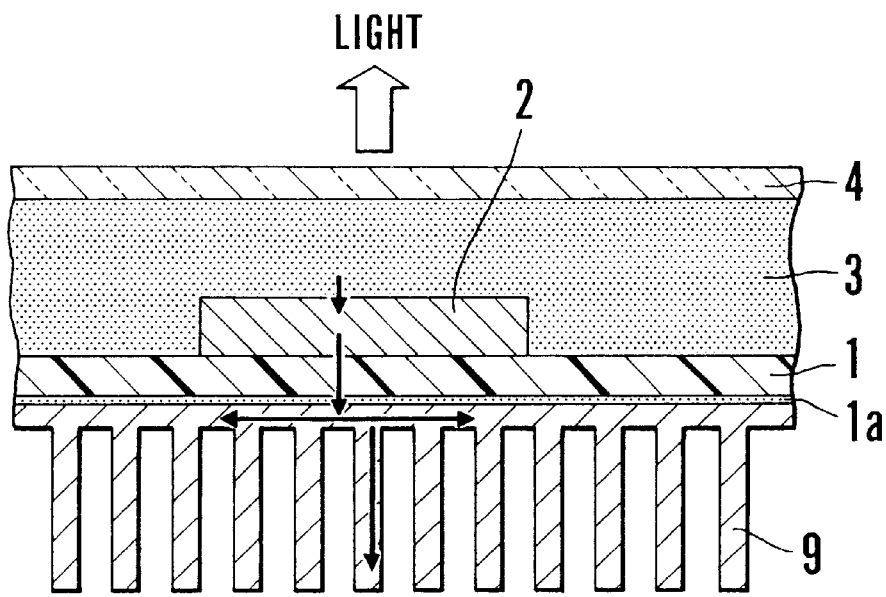
FIG. 16 is an enlarged sectional view of the embodiment shown in FIG. 15.

The second embodiment of the present invention will be described with reference to FIGS. 15 and 16.

In the first embodiment, circuit components are mounted on the lower surface of the board 1, and the organic EL elements and the drivers are integrated through the board 1.

In the second embodiment, heat radiation fins 9 are mounted on the lower surface of a board 1 through an adhesion layer 1a.

On the upper surface of the board 1, in the same manner as in the first embodiment, an organic thin film 3 is sandwiched by striped metal electrodes 2 and transparent electrodes 4, that perpendicularly intersect each other, to constitute organic EL elements. Different from the first embodiment, in the second embodiment, no via interconnections 6 are formed, and the respective electrodes are connected to flexible leads (FPC) at their peripheral portions on the upper surface side, so that they are connected to the drivers formed on another board.

In this embodiment, the adhesion layer 1a thermally connects the board 1 and heat radiation fins 9 to each other well; thermal grease having a thickness of about 10 $\mu$m to 50 $\mu$m is used as the adhesion layer 1a. As the heat radiation fins 9, those made of Al material, commercially available, and having an appropriate size, are used. Although the heat radiation fins 9 are not particularly fixed to the board 1 with screws or the like in this embodiment, it is preferable to fix the heat radiation fins 9 with this method or other appropriate methods, as is often the case.

The effect of mounting the heat radiation fins 9 resides in that heat of about 1 W to 10 W which is generated upon emission of the organic EL elements can be radiated promptly to suppress any temperature increase. The material of the organic thin film 3 which is currently available lacks heat resistance. According to the second embodiment, this drawback is compensated for and the application field can be enlarged. As is indicated in FIG. 11, heat generated by the organic thin film 3 is absorbed by the metal electrodes 2 rather than by the transparent electrodes 4 as the metal electrodes 2 have higher heat conductivity, is diffused, penetrates the board 1, is transferred to the heat radiation fins 9 through the adhesion layer 1a, and is radiated to the atmosphere from the heat radiation fins 9. Although the temperature difference between the organic thin film 3 and the atmosphere is small and the quantitative effect is accordingly small, an effect of compensating for the lack of heat resistance of the organic thin film 3 can be sufficiently obtained.

Figure 17:
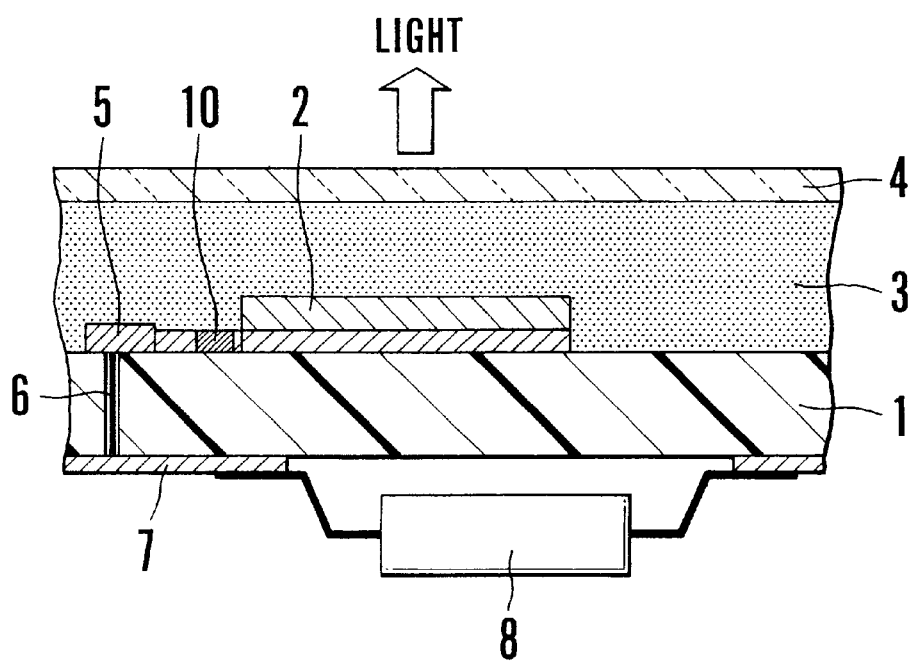
FIG. 17 is an enlarged sectional view showing the third embodiment of the present invention.

The third embodiment of the present invention will be described with reference to FIG. 17.

In the second embodiment, the heat radiation fins 9 are mounted on the lower surface of the board 1 to suppress any temperature increase of the organic thin film 3. In the third embodiment, cooling elements such as Peltier effect elements 10 are formed on metal interconnections 7 of a board 1, thereby cooling a heated organic thin film 3.

When the Peltier effect elements 10 are used as the cooling elements, a cooling effect can be obtained with a drive current; as the drive current increases, the cooling effect advantageously increases. To form the Peltier effect elements 10, the metal interconnections 7 of the board 1 are patterned in advance to correspond to the Peltier effect elements 10, and the Peltier effect elements 10 are formed by deposition.

In formation of the Peltier effect elements 10, the shadow mask method using, e.g., a metal mask, is employed for patterning. In the case of this embodiment, the EL display device must be assembled so as not impair the Peltier effect elements 10 during a surface treatment.

What is claimed is:

1. An EL display device having organic EL elements in each of which an organic thin film having a transparent electrode on one surface and a metal electrode on the other surface is formed on a substrate and positive and negative carriers are injected from said transparent electrode and said metal electrode, respectively, to emit light, wherein said substrate is a circuit board having a metal interconnection and said metal electrode of each of said organic EL elements is formed at a predetermined portion on an upper surface of said circuit board, and wherein radiation fins are mounted on said lower surface of said circuit board, and heat of said organic EL elements is radiated from said radiation fins.

2. A device according to claim 1, having a structure in which said metal electrode for each of said organic EL elements is formed at a portion other than on said metal interconnection of said circuit board and can be connected to said metal interconnection of said circuit board.

3. A device according to claim 1, having a structure in which said organic EL elements are arranged in a dot matrix of n rows×m columns or n rows×n columns.

4. A device according to claim 3, comprising a via interconnection for connecting said metal interconnection formed on said upper surface of said circuit board to a lower surface of said circuit board so as to achieve connection to each of said organic EL elements arranged on said upper surface of said circuit board, and a metal interconnection formed on said lower surface of said circuit board in order to connect said via interconnection to a driver formed on said lower surface of said circuit board.

5. An EL display device having organic EL elements in each of which an organic thin film having a transparent electrode on one surface and a metal electrode on the other surface is formed on a substrate and positive and negative carriers are injected from said transparent electrode and said metal electrode, respectively, to emit light, wherein said substrate is a circuit board having a metal interconnection and said metal electrode of each of said organic EL elements is formed at a predetermined portion on an upper surface of said circuit board, and wherein a cooling element is inserted in a connecting portion of said metal electrode of each of said organic EL elements and said metal interconnection of said circuit board.

6. A device according to claim 5, having a structure in which said metal electrode for each of said organic EL elements is formed at a portion other than on said metal interconnection of said circuit board and can be connected to said metal interconnection of said circuit board.

7. A device according to claim 5, wherein said cooling element is a Peltier effect element.

8. A device according to claim 5, having a structure in which said organic EL elements are arranged in a dot matrix of n rows×m columns or n rows×n columns.

9. A device according to claim 8, comprising a via interconnection for connecting said metal interconnection formed on said upper surface of said circuit board to a lower surface of said circuit board so as to achieve connection to each of said organic EL elements arranged on said upper surface of said circuit board, and a metal interconnection formed on said lower surface of said circuit board in order to connect said via interconnection to a driver formed on said lower surface of said circuit board.

* * * * *